(12) United States Patent
Chang

(10) Patent No.: US 7,288,982 B2
(45) Date of Patent: Oct. 30, 2007

(54) SIGNAL CONVERTING CIRCUIT

(75) Inventor: Cheng-Kuo Chang, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/312,726

(22) Filed: Dec. 19, 2005

(65) Prior Publication Data

US 2006/0132215 A1 Jun. 22, 2006

(30) Foreign Application Priority Data

Dec. 17, 2004 (CN) ............ 2004 1 0077630

(51) Int. Cl.
*H03L 5/00* (2006.01)

(52) U.S. Cl. .................. 327/333; 326/62

(58) Field of Classification Search .......... 327/333
See application file for complete search history.

(56) References Cited

U.S. PATENT DOCUMENTS 4,456,838 A * 6/1984 Taguchi et al. ............ 326/80
6,452,419 B1 * 9/2002 Ovens ...................... 326/80
6,738,855 B1 5/2004 Goldman ................. 710/315
7,091,747 B2 * 8/2006 Hsieh ....................... 326/68
2004/0022204 A1 * 2/2004 Trembley ................. 370/285
2006/0033548 A1 * 2/2006 Hsieh ....................... 327/333

* cited by examiner

*Primary Examiner*—Quan Tra
*Assistant Examiner*—Khareem E. Almo
(74) *Attorney, Agent, or Firm*—Morris Manning Martin LLP; Tim Tingkang Xia, Esq.

(57) ABSTRACT

A signal converting circuit includes a voltage level converter circuit, a power circuit, a signal separation circuit, a signal modifying circuit, and a clamping circuit. The power circuit provides voltage to the signal modifying circuit and the voltage level converter circuit. The voltage level converter circuit converts signals from the RS232 interface to I²C interface compliant signals. When the I²C interface transmits signal to the RS232 interface, the signal separation circuit separates signal from the RS232 interface into two separate signals. The signal modifying circuit receives controlling signals sent from the RS232 interface and modifies the signals into a standard square wave signal, the modified standard square wave signal is sent to the clamping circuit. The clamping circuit clamps the voltage level of the signal according to the level that the I²C interface accepts.

14 Claims, 4 Drawing Sheets

SIGNAL CONVERTING CIRCUIT

BACKGROUND OF THE INVENTION

1. Field of the Invention

The present invention relates to signal converting circuits, and more particularly to a signal converting circuit which can interconvert RS232 (also know as EIA232) signals with I²C signals.

2. General Background

I²C (Inter-Integrated-Circuit) is a low-bandwidth, short-distance, two-wire interface for communication amongst ICs and peripherals. I²C was defined by Philips Semiconductor in the early 1980's. The BUS physically consists of 2 active wires and a ground connection. The active wires, SDA and SCL, are both bidirectional. Where SDA is the serial data line and SCL is the serial clock line. But if the transfer distance is too long, the I²C signal may suffer distortion or possibly not be received by a receiver. The RS232 model allows long distance data transmission up to 1000 meters. To obtain the advantages of long distance transmission of signals, a converting circuit is required for converting the signal from the I²C interface to the RS232 interface at the sending end and converting the signal from the RS232 interface to the I²C interface at the receiving end.

What is needed is a signal converting circuit which can interconvert RS232 signals with I²C signals.

SUMMARY

An exemplary signal converting circuit adapted for converting RS232 signals into I²C signals and vice versa, the signal converting circuit includes a voltage level converter circuit, a power circuit, a signal separation circuit, a signal modifying circuit, and a clamping circuit. The voltage level converter circuit has a first input end connected to an SDA line of an I²C interface, and an output end connected to a receiving pin of an RS232 interface. The power circuit has an input end connected to a request-to-send pin of the RS232 interface and a power supply respectively, and an output end connected to a second input end of the voltage level converter circuit. The signal separation circuit separates a signal into two separate signals, and an input end of the separation circuit is connected to a transmitted data pin of the RS232 interface. The signal modifying circuit has a first input end connected to a first output end of the signal separation circuit, a second input end connected to the output end of the power circuit, and a controlling end connected to the request-to-send pin of the RS232 interface. The clamping circuit has a first end connected to the second output end of the signal separation circuit, a second output end connected to the output end of the signal modifying circuit, a first output end connected to the SDA line of the I²C interface and the second output end connected to an SCL line of the I²C interface. The clamping circuit limits the signals sent from the signal separation circuit and the signal modifying circuit to the specific voltage of the SDA line and SCL line.

It is simple and economical to use the signal converting circuit to convert RS232 signals into I²C signals and vice versa.

Other advantages and novel features will become more apparent from the following detailed description when taken in conjunction with the accompanying drawings, in which:

DETAILED DESCRIPTION OF THE EMBODIMENT

Figure 1:
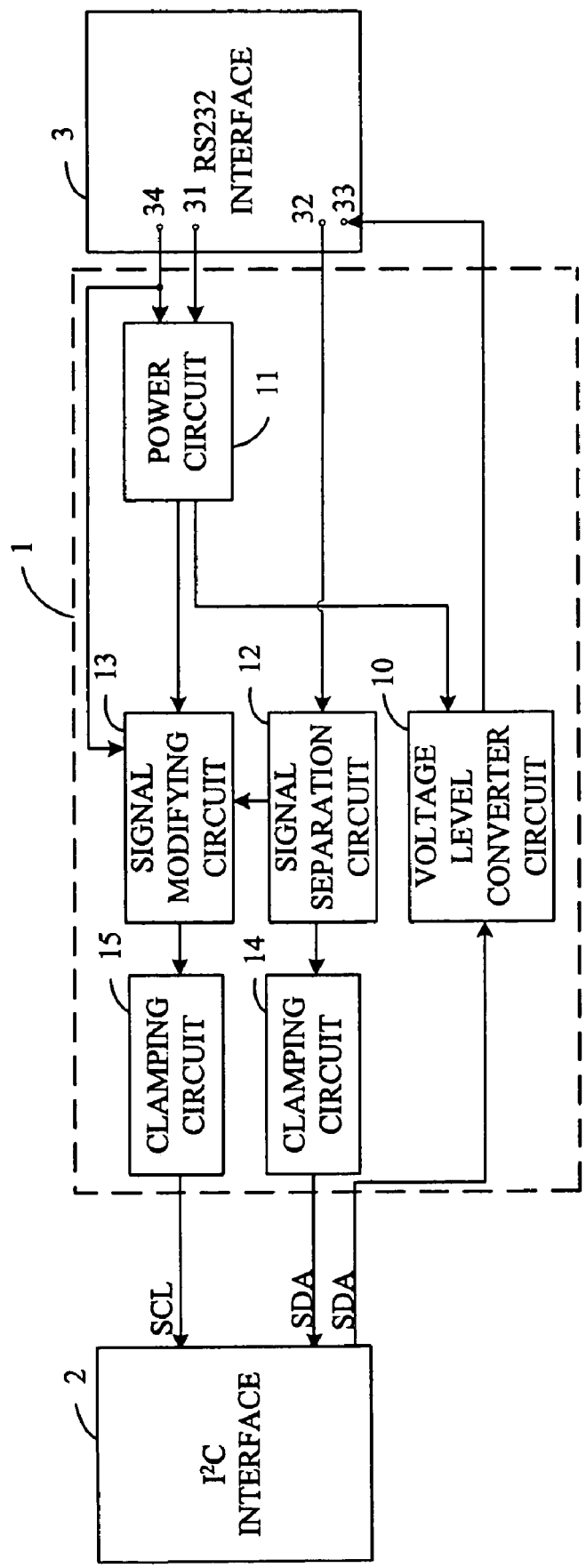
FIG. 1 is a block diagram of a signal converting circuit in accordance with a preferred embodiment of the present invention, together with an I²C interface and a RS232 interface.

Referring to FIG. 1, a signal converting circuit in accordance with a preferred embodiment of the present invention is shown. A signal converting circuit 1 is for interconverting RS232 signals with I²C signals. A RS232 interface includes a first pin 31, a second pin 32, a third pin 33, and a fourth pin 34. The first pin 31 is coupled to a voltage to provide power to the signal converting circuit 1. The second pin 32 is a transmitted data pin, the third pin 33 is a received data pin, and the fourth pin 34 is a request-to-send (RTS) pin. The fourth pin 34 provides power to the signal converting circuit 1 when the RS232 interface 3 sends RTS signals to the I²C interface 2. In this embodiment the signal converting circuit 1 obtains power from the first pin 31 and the fourth pin 34 of the RS232 interface 3.

The signal converting circuit 1 includes a voltage level converter circuit 10, a power circuit 11, a signal separation circuit 12, a signal modifying circuit 13, and two clamping circuits 14, 15.

The first and fourth pins 31, 34 of the RS232 interface 3 are connected to two inputs of the power circuit 11 consecutively, and the fourth pin 34 is also connected to an input of the signal modifying circuit 13, and the second pin 32 is connected to an input of the signal separation circuit 12. Output of the power circuit 11 is separately connected to inputs of the signal modifying circuit 13 and the voltage level converter circuit 10. An output of the signal modifying circuit 13 is connected to an input of the clamping circuit 15. An output of the clamping circuit 15 is connected to an SCL line of the I²C interface 2. Outputs of the signal separation circuit 12 are connected to inputs of the signal modifying circuit 13 and the clamping circuit 14 consecutively. An output of the clamping circuit 14 is connected with an SDA line of the I²C interface 2. The SDA line of the I²C interface 2 is also connected to an input of the voltage level converter circuit 10. An output of the voltage level converter circuit 10 is connected to the third pin 33 of the RS232 interface 3. The SDA line can send and receive signals, while the SCL line receives signals only.

Figure 2:
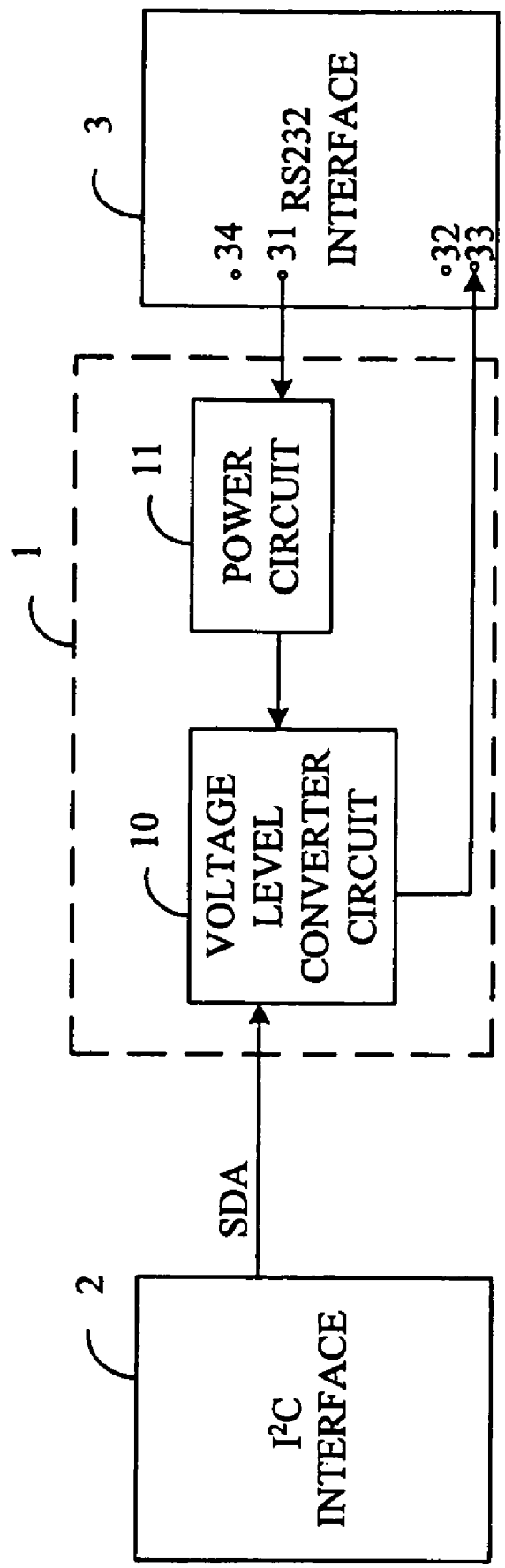
FIG. 2 is a block diagram of a signal converting circuit in accordance with a preferred embodiment of the present invention showing the I²C interface transmitting signals to the RS232 interface.

Referring to FIG. 2, when the I²C interface 2 sends signals to the RS232 interface 3, the second pin 32 and the fourth pin 34 are not active. The voltage level converter circuit 10 converts the signals that are received by the SDA line into RS232 interface 3 compliant signals, then the converted signals are transmitted to the third pin 33 of the RS232 interface 3. The power circuit 11 provides voltage to the voltage level converter circuit 10.

Figure 3:
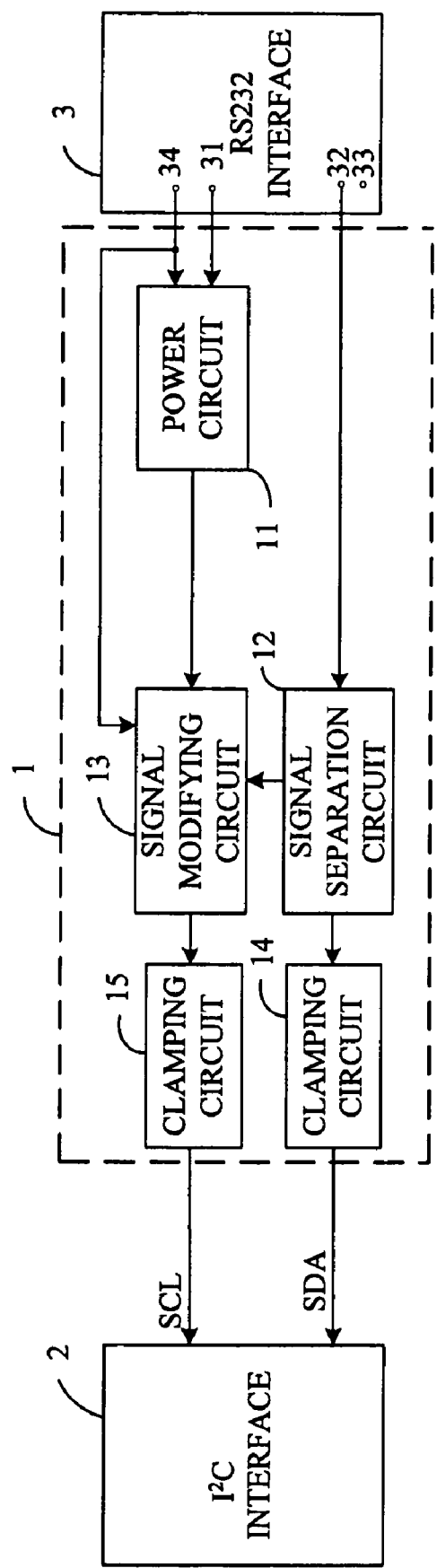
FIG. 3 is a block diagram of a signal converting circuit in accordance with a preferred embodiment of the present invention showing the RS232 interface transmitting signals to the I²C interface.

Referring to FIG. 3, when the RS232 interface 3 transmits signals to the I²C interface 2, the fourth pin 34 provides voltage to the power circuit 11, and the fourth pin 34 is also connected to the signal modifying circuit 13 to control the working status of the signal modifying circuit 13. The second pin 32 of the RS232 interface 3 transmits signals to the signal separation circuit 13. The signal separation circuit 13 separates the signals into two same frequency signals to send to the signal modifying circuit 13 and the clamping circuit 14 respectively. The clamping circuit 14 clamps the voltage level of the signal according to the level that the SDA line accepts, then sends the signals to the I²C interface 2 via the SDA line. The signal modifying circuit 13 receives controlling signals from the RS232 interface 3 via the fourth pin 34, modifies the signal from the signal separation circuit 12 into a standard square wave signal, the modified standard square wave signal is sent to the clamping circuit 15. The clamping circuit 15 clamps the voltage level of the signal according to the level that the SCL line accepts, then the signals are sent to the I²C interface 2 via the SCL line. The power circuit 11 provides voltage to the signal modifying circuit 13.

Figure 4:
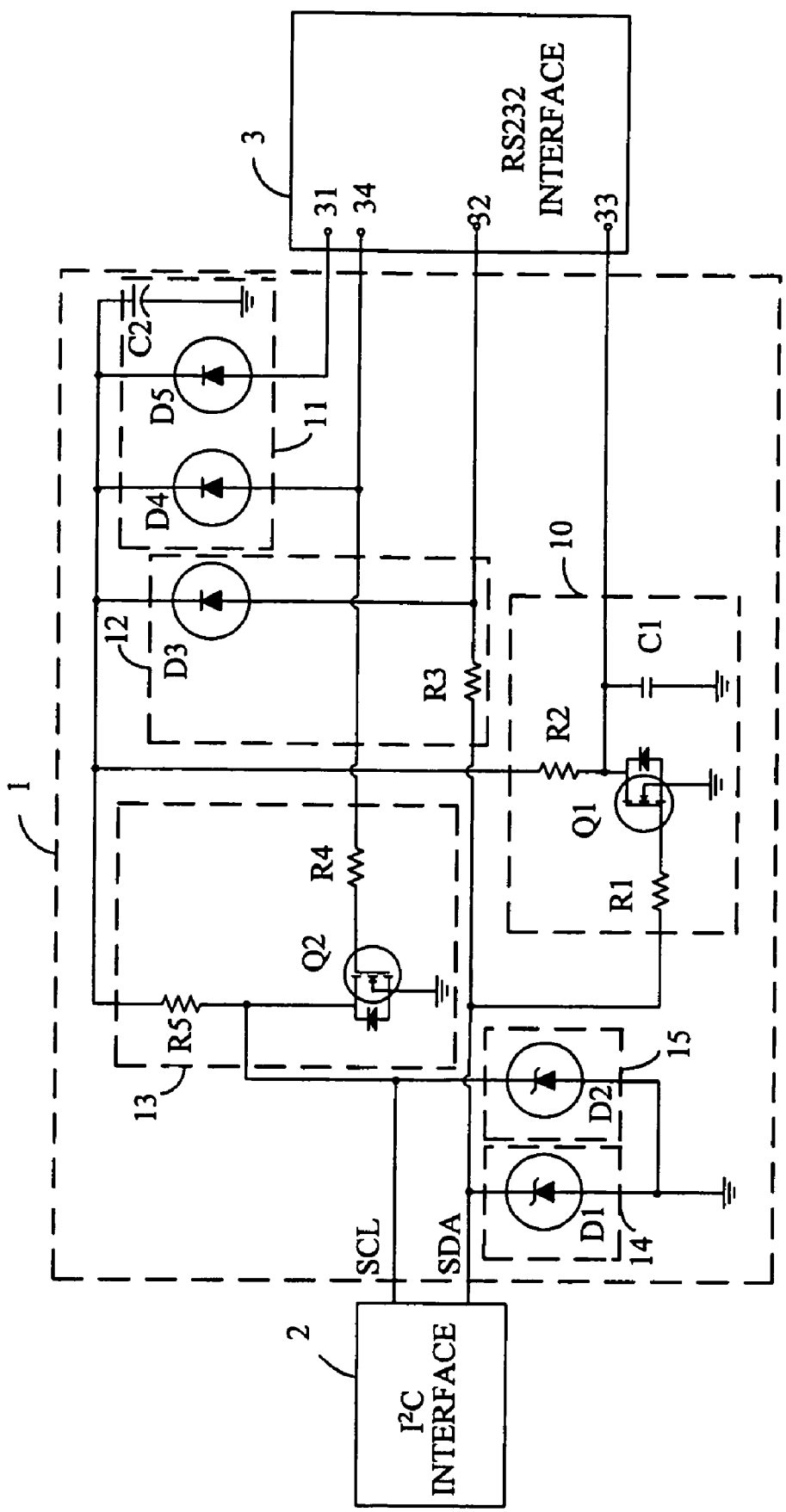
FIG. 4 is a circuit diagram of the signal converting circuit of FIG. 1.

Referring to FIG. 4, a detailed circuit diagram is shown according to the present invention. The voltage level converter circuit 10 includes a transistor Q1, two resistors R1 and R2, and a capacitor C1. An end of the resistor R1 is the input end of the voltage level circuit 10, and is connected to the SDA line of the I²C interface 2. Another end of the resistor R1 is connected to the gate of the transistor Q1. The source of the transistor Q1 is grounded. The drain of the transistor Q1 is connected to an end of the resistor R2. The output end of the voltage level converter circuit 10 is at a node between the drain of the transistor Q1 and the resistor R2 and is connected to the third pin 33 of the RS232 interface 3. Another end of the resistor R2 is the other input end of the voltage level converter circuit 10 and connected to the power circuit 11. An end of the capacitor C1 is grounded, and the other end of the capacitor C1 is connected to a drain of the transistor Q1. The power circuit 11 includes a diode D4, a diode D5, and a capacitor C2. An anode of the diode D4 is connected to the fourth pin 34 of the RS232 interface 3, and a cathode of the diode D4 is connected to the resistor R2 of the voltage level converter circuit 10. An anode of the diode D5 is connected to the first pin 31 of the RS232 interface 3, and a cathode of the diode D5 is connected to the resistor R2 of the voltage level converter circuit 10. An end of the capacitor C1 is grounded, and the other end of the capacitor C1 is connected to the cathode of the diode D5.

The signal separation circuit 12 includes a resistor R3 and a diode D3. An end of the resistor R3 is coupled to the second pin 32 of the RS232 interface 3, the other end of the resistor R3 is the output end of the signal separation circuit 12 and connected to the clamping circuit 14. An anode of the diode D3 is connected to the second pin 32 of the RS232 interface 3, and the other end is the output end of the signal separation circuit 12 and is connected to the signal modifying circuit 13. The signal modifying circuit 13 includes a resistor R4, a resistor R5, and a transistor Q2. An end of the resistor R4 is coupled to the fourth pin 34 of the RS232 interface 3, the other end of the resistor R4 is connected to a gate of the transistor Q2. A source of the transistor Q2 is grounded, a drain of the transistor Q2 is connected to an end of the resistor R5, and the other end of the resistor R5 is connected to the cathode of the diode D3 of the signal separation circuit 12. The clamping circuit 14 is a zener diode D1, an anode of the zener diode D1 is grounded, and a cathode of the zener diode D1 is connected to the SDA line and the resistor R3 of the signal separation circuit 12. The clamping circuit 15 is a zener diode D2, an anode of the zener diode D2 is grounded, and a cathode of the zener diode D2 is connected with the SCL line of the I²C interface 2 and the drain of the transistor Q2 of the signal modifying circuit 13.

When the I²C interface 2 transmits signals to the RS232 interface 3, the second pin 32 and the fourth pin 34 of the RS232 interface 3 do not work. The first pin 31 is connected to a voltage, the diode D5 is turned on, the voltage of the cathode of the diode D5 is at a high level. Signals from the SDA line of the I²C interface 2 are sent to the gate of the transistor Q1 via the resistor R1 which limits the current flow to the gate of the transistor Q1. When the signal sent from the I²C interface 2 is at a low level, the transistor Q1 is turned off, the voltage of the drain of the transistor Q1 is equal to the voltage of the cathode of the diode D5, that is at a high level, so the voltage of the third pin 33 of the RS232 interface is at a high level. When the signal sent from the I²C interface 2 is at a high level, the transistor Q1 is turned on, the voltage of the drain of the transistor Q1 is at a low level, so the voltage of the third pin 33 of the RS232 interface is at a low level. The capacitor C1 is for wave filtering.

When the RS232 interface 3 transmits signals to the I²C interface 2, the signals are transmitted to a node between the resistor R3 and the diode D3 then are separated and follow two paths: one is transmitted to the resistor R3, the other transmitted to the diode D3. A signal is sent to the cathode of the zener diode D1 of the clamping circuit 14 via the resistor R3 which limits the current flow to the zener diode D1. If the signal transmitted to the zener diode D1 is at a high voltage, the zener diode D1 clamps the high voltage to an SDA line's specific voltage, and the signal is then sent to the SDA line. If the signal transmitted to the zener diode D1 is at a low voltage, the low voltage signal is sent to the SDA line directly. In this way, the signal from the RS232 interface 3 is transmitted to the I²C interface 2.

When the signal sent to the diode D3 is high voltage, the diode D3 is turned on, the cathode of the diode D3 is at high level, at this time, if the signal sent from the fourth pin 34 is at a high level, the transistor Q2 is turned on, so the signal transmitted to the SCL line is at a low level. If the signal sent from the fourth pin 34 is at a low level, the transistor Q2 is turned off, the high voltage at the cathodes of the diodes D3 and D5 is sent to the cathode of the zener diode D2 via the resistor R5. The high voltage is higher than the avalanche voltage of the zener diode D2, the zener diode D2 clamps the high voltage to an SCL line's specific voltage, and the signal is then sent to the SDA line.

When the signal sent to the diode D3 is low voltage, the diode D3 is turned off, at this time, if the signal sent from the fourth pin 34 is at a high level, the transistor Q2 is turn on, so the signal transmitted to the SCL line is at a low level. If the signal sent from the fourth pin 34 is at a low level, the transistor Q2 is turned off, the high voltage at the cathode of the diode D5 is sent to the cathode of the zener diode D2 via the resistor R5. The high voltage is higher than the avalanche voltage of the zener diode D2, the zener diode D2 clamps the high voltage to an SCL line's specific voltage, and the signal is then sent to the SDA line.

It is believed that the present embodiment and its advantages will be understood from the foregoing description, and it will be apparent that various changes may be made thereto without departing from the spirit and scope of the invention or sacrificing all of its material advantages, the example hereinbefore described merely being a preferred or exemplary embodiment of the invention.

What is claimed is:

1. A signal converting circuit adapted for interconverting RS232 signals with I²C signals, the signal converting circuit comprising:
   a voltage level converter circuit, a first input end of the voltage level circuit connected to an SDA line of an I²C interface, an output end of the voltage level circuit connected to a received data pin of an RS232 interface;
   a power circuit, an input end of the power circuit connected to a request-to-send pin of the RS232 interface and a power supply respectively, and an output end of the power circuit connected to a second input end of the voltage level converter circuit;
   a signal separation circuit for separating a signal into two separate signals, an input end of the separation circuit connected to a transmitted data pin of the RS232 interface;
   a signal modifying circuit, a first input end of the signal modifying circuit connected to a first output end of the signal separation circuit, a second input end of the signal modifying circuit connected to the output end of the power circuit, a controlling end of the signal modifying circuit connected to the request-to-send pin of the RS232 interface; and
   a clamping circuit, a first input end of the clamping circuit connected to a second output end of the signal separation circuit, a second output end of the clamping circuit connected to an output end of the signal modifying circuit, a first output end of the clamping circuit connected to the SDA line of the I²C interface, and the second output end of the clamping circuit connected to an SCL line of the I²C interface, the clamping circuit adapted for limiting the signal sent from the signal separation circuit and the signal modifying circuit to the specific voltage of the SDA line and SCL line.

2. The signal converting circuit as claimed in claim 1, wherein the voltage level converter circuit comprises:
   a first resistor connected to the SDA line of the I²C interface;
   a first transistor having a gate connected to the first resistor, a source connected to the ground, and a drain connected to the received data pin of the RS232 interface; and
   a second resistor connected between the drain of the first transistor and the output end of the power circuit.

3. The signal converting circuit as claimed in claim 2, wherein the voltage level converter circuit further comprises a capacitor connected between the drain of the first transistor and the ground.

4. The signal converting circuit as claimed in claim 1, wherein the power circuit comprises a first diode having an anode connected to a power pin of the RS232 interface and a cathode being the output end of the power circuit.

5. The signal converting circuit as claimed in claim 4, wherein the power circuit comprises a second diode having an anode connected to the request-to-send pin of the RS232 interface and a cathode connected to the cathode of the first diode.

6. The signal converting circuit as claimed in claim 5, wherein the power circuit comprises a capacitor connected between the cathode of the second diode and the ground.

7. The signal converting circuit as claimed in claim 1, wherein the signal separation circuit comprises:
   a third resistor with an end connected to the transmitted data pin of the RS232 interface and the other end being the second output end of the signal separation circuit; and
   a diode with an anode connected to the transmitted data pin of the RS232 interface and a cathode being the first output end of the signal separation circuit.

8. The signal converting circuit as claimed in claim 1, wherein the signal modifying circuit comprises:
   a fourth resistor connected to the request-to-send pin of the RS232 interface; and
   a second transistor having a gate connected to the fourth resistor, a source connected to the ground, and a drain being the output end of the signal modifying circuit.

9. The signal converting circuit as claimed in claim 1, wherein the clamping circuit comprises:
   a first zener diode having an anode connected to the ground and a cathode connected to the SDA line of the I²C interface; and
   a second zener diode having an anode connected to the ground and a cathode connected to the SCL line of the I²C interface.

10. A signal converting circuit for converting I²C signals to RS232 signals, an I²C interface comprising an SDA line for sending and receiving data, an RS232 interface comprising a received data pin and a power pin, the signal converting circuit comprising:
    a power circuit connected to the power pin of the RS232 interface; and
    a voltage level converter circuit comprising:
    a first resistor connected to the SDA line of the I²C interface;
    a transistor having a gate connected to the first resistor, a source connected to the ground, and a drain connected to the received data pin of the RS232 interface; and
    a second resistor connected between the drain of the transistor and the power circuit,
    wherein the power circuit comprises a diode having an anode connected to the power pin of the RS232 interface and a cathode connected to the second resistor and wherein the voltage level converter circuit further comprises a capacitor connected between the drain of the RS232 interface and the ground.

11. A signal converting circuit for converting RS232 signals to I²C signals, an I²C interface comprising an SDA line and an SCL line, an RS232 interface comprising a power pin, a transmitted data pin, and a request-to-send pin, the signal converting circuit comprising:
    a power circuit, an input end of the power circuit connected to the request-to-send pin of the RS232 interface and a power supply respectively;
    a signal separation circuit for separating signals into two separate signals, an input end of the separation circuit connected to the transmitted data pin of the RS232 interface;
    a signal modifying circuit, a first input end of the signal modifying circuit connected to a first output end of the signal separation circuit, a second input end of the signal modifying circuit connected to an output end of the power circuit, a controlling end of the signal modifying circuit connected to the request-to-send pin of the RS232 interface; and
    a clamping circuit, a first end of the clamping circuit connected to the second output end of the signal separation circuit, a second output end of the clamping circuit connected to the output end of the signal modifying circuit, a first output end of the clamping circuit connected to the SDA line of the I²C interface and the second output end of the clamping circuit connected to the SCL line of the I²C interface, the clamping circuit adapted for limiting signals sent from the signal separation circuit and the signal modifying circuit to the specific voltage of the SDA line and SCL line.

12. The signal converting circuit as claimed in claim 11, wherein the signal separation circuit comprises:
   a first resistor with an end connected to a transmitted data pin of the RS232 interface and the other end being the second output end of the signal separation circuit; and
   a diode with an anode connected to the transmitted data pin of the RS232 interface and a cathode being the first output end of the signal separation circuit.

13. The signal converting circuit as claimed in claim 11, wherein the signal modifying circuit comprises:
   a second resistor connected to the request-to-send pin of the RS232 interface; and
   a transistor having a gate connected to the second resistor, a source connected to the ground, and a drain being the output end of the signal modifying circuit.

14. The signal converting circuit as claimed in claim 11, wherein the clamping circuit comprises:
   a first zener diode having an anode connected to the ground and a cathode connected to the SDA line of the I²C interface; and
   a second zener diode having an anode connected to the ground and a cathode connected to the SCL line of the I²C interface.

* * * * *